United States Patent
Matsuda (10) Patent No.: US 11,437,417 B2
(45) Date of Patent: Sep. 6, 2022

(54) PHOTOELECTRIC CONVERSION APPARATUS AND PHOTOELECTRIC CONVERSION SYSTEM

(71) Applicant: CANON KABUSHIKI KAISHA, Tokyo (JP)

(72) Inventor: Takashi Matsuda, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 326 days.

(21) Appl. No.: 16/847,454

(22) Filed: Apr. 13, 2020

(65) Prior Publication Data
US 2020/0335533 A1 Oct. 22, 2020

(30) Foreign Application Priority Data
Apr. 19, 2019 (JP) .............................. JP2019-080494

(51) Int. Cl.
*H01L 27/146* (2006.01)
*H04N 5/351* (2011.01)
*H04N 5/378* (2011.01)

(52) U.S. Cl.
CPC .... *H01L 27/1461* (2013.01); *H01L 27/14612* (2013.01); *H04N 5/351* (2013.01); *H04N 5/378* (2013.01)

(58) Field of Classification Search
CPC ................................................. H01L 27/1461
See application file for complete search history.

(56) References Cited

U.S. PATENT DOCUMENTS

2010/0220228 A1* 9/2010 Otake ................ H04N 9/04555
348/311
2018/0219033 A1 8/2018 Toyoguchi

FOREIGN PATENT DOCUMENTS

JP 2015-5699 A 1/2015
JP 2018-107409 A 7/2018

* cited by examiner

*Primary Examiner* — Thanh Luu
(74) *Attorney, Agent, or Firm* — Canon U.S.A., Inc. IP Division (57) ABSTRACT

The first photoelectric conversion unit and the second photoelectric conversion unit each include a first semiconductor region of a first conductivity type disposed at a first depth, a second semiconductor region of a second conductivity type disposed at a second depth, a third semiconductor region of the first conductivity type disposed at a third depth, and a fourth semiconductor region of the second conductivity type disposed at a fourth depth. An impurity concentration of the second semiconductor region of the first photoelectric conversion unit and an impurity concentration of the second semiconductor region of the second photoelectric conversion unit are different at the second depth.

13 Claims, 8 Drawing Sheets

PHOTOELECTRIC CONVERSION APPARATUS AND PHOTOELECTRIC CONVERSION SYSTEM

BACKGROUND

Field of the Disclosure

The present disclosure relates to a photoelectric conversion apparatus.

Description of the Related Art

In recent years, in a photoelectric conversion apparatus represented by a charge coupled device (CCD) image sensor and a complementary metal oxide semiconductor (CMOS) image sensor, a sensitivity and a saturation charge quantity of a photoelectric conversion unit are important characteristics that affect the performance of the photoelectric conversion apparatus. For the photoelectric conversion unit of the CCD image sensor or CMOS image sensor, use of an embedded photodiode formed of a p-n junction has become mainstream. The p-n junction is a junction between a p-type semiconductor region provided on a surface portion of a semiconductor substrate and an n-type semiconductor region forming a charge accumulation region. In this case, a signal career generated in the photoelectric conversion unit is an electron. In Japanese Patent Application Laid-Open No. 2018-107409, a p-type semiconductor region is located under the n-type semiconductor region to reduce downward expansion of a depletion layer from an n-type semiconductor region.

In Japanese Patent Application Laid-Open No. 2018-107409, no study has been made on a case where a photoelectric conversion apparatus includes a plurality of photoelectric conversion units varying in sensitivity. For example, there is a possibility that image quality decreases if a photoelectric conversion unit for photoelectrically converting visible light and a photoelectric conversion unit for photoelectrically converting infrared light have the same saturation charge quantity.

SUMMARY OF THE INVENTION

According to an aspect of the present disclosure, a photoelectric conversion apparatus includes a first photoelectric conversion unit disposed within a semiconductor substrate, and a second photoelectric conversion unit disposed adjacent to the first photoelectric conversion unit, wherein the first photoelectric conversion unit and the second photoelectric conversion unit each include a first semiconductor region of a first conductivity type that is disposed at a first depth from a first plane of the semiconductor substrate, and has the same carrier as a signal carrier as a majority carrier, a second semiconductor region of a second conductivity type that is disposed at a second depth from the first plane of the semiconductor substrate that is deeper than the first depth, a third semiconductor region of the first conductivity type disposed at a third depth from the first plane of the semiconductor substrate that is deeper than the second depth, and a fourth semiconductor region of the second conductivity type disposed at a fourth depth from the first plane of the semiconductor substrate that is deeper than the third depth, wherein the fourth semiconductor region is continuously disposed between the first photoelectric conversion unit and the second photoelectric conversion unit, and wherein an impurity concentration of the second semiconductor region of the first photoelectric conversion unit and an impurity concentration of the second semiconductor region of the second photoelectric conversion unit are different at the second depth.

Further features of the present disclosure will become apparent from the following description of exemplary embodiments with reference to the attached drawings.

DESCRIPTION OF THE EMBODIMENTS

Exemplary embodiments described below are intended to embody a technical idea of the present disclosure, and are not intended to limit the present disclosure. The sizes of members illustrated in each drawing and the positional relationships between the members may be exaggerated to provide clear description. In the following description, similar configurations are provided with the same reference numerals and the description thereof will not be repeated.

In the following description, a signal carrier is an electron. A semiconductor region of a first conductivity type is a region where a carrier of a first polarity that is the same as the signal carrier is a majority carrier, and this region is an n-type semiconductor region. A semiconductor region of a second conductivity type is a region where a carrier is of a second polarity, and this region is a p-type semiconductor region. The present disclosure is also applicable to a case where the signal carrier is a positive hole. In this case, the semiconductor region of the first conductivity type is the p-type semiconductor region, and the semiconductor region of the second conductivity type is the n-type semiconductor region.

In the following description, elements or circuits having similar functions may be provided with the same reference numerals, and distinguished from each other by adding different indices of alphabets to the respective ends. In a case where it is not necessary to distinguish between the elements or circuits, a common part will be described without mentioning the added indices such as "a" and "b".

A first exemplary embodiment of the present disclosure will be described with reference to FIGS. 1 to 5.

Figure 1:
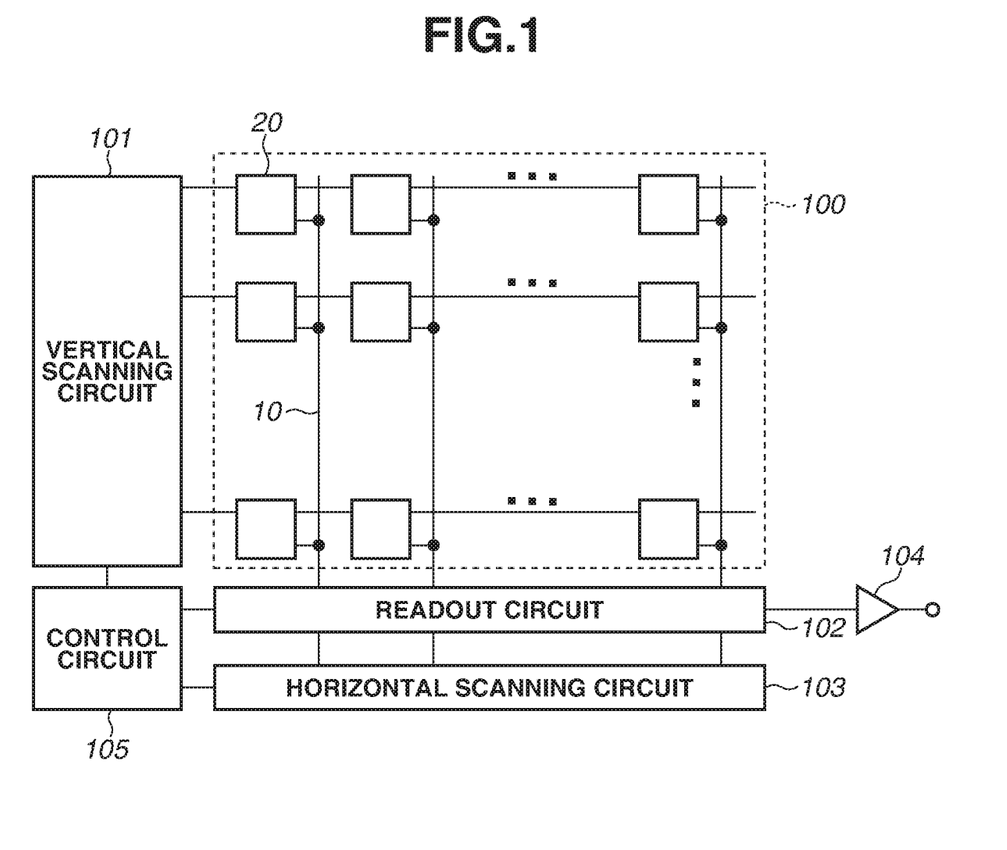
FIG. 1 is a block diagram illustrating a configuration of a photoelectric conversion apparatus according to a first exemplary embodiment.

FIG. 1 is a block diagram illustrating a schematic configuration of a photoelectric conversion apparatus according to the present exemplary embodiment. The photoelectric conversion apparatus includes a pixel region 100, a vertical scanning circuit 101, a readout circuit 102, a horizontal scanning circuit 103, an output circuit 104, and a control circuit 105. In the pixel region 100, a plurality of pixels 20 is two-dimensionally arranged in a plurality of rows and a plurality of columns. The vertical scanning circuit 101 is a circuit unit that supplies the pixel 20 with a control signal for driving a readout circuit included in the pixel 20, when a signal is read out from the pixel 20. The readout circuit 102 is a circuit unit that performs, for example, signal processing such as amplification processing and addition processing, for the signal read out from the pixel 20. The readout circuit 102 may further include a differential amplifier circuit, a sample-and-hold circuit, and an analog-to-digital (A/D) converter circuit. The horizontal scanning circuit 103 is a circuit that supplies the readout circuit 102 with a control signal for sequentially transferring the signals processed in the readout circuit 102 to the output circuit 104, column by column. The control circuit 105 is a circuit unit for supplying control signals for controlling the operation and the timing of each of the vertical scanning circuit 101, the readout circuit 102, and the horizontal scanning circuit 103. The output circuit 104 is configured of a device such as a buffer amplifier or a differential amplifier. The output circuit 104 is a circuit unit for outputting a pixel signal read out from the readout circuit 102 to a signal processing unit provided outside the photoelectric conversion apparatus.

Figure 2:
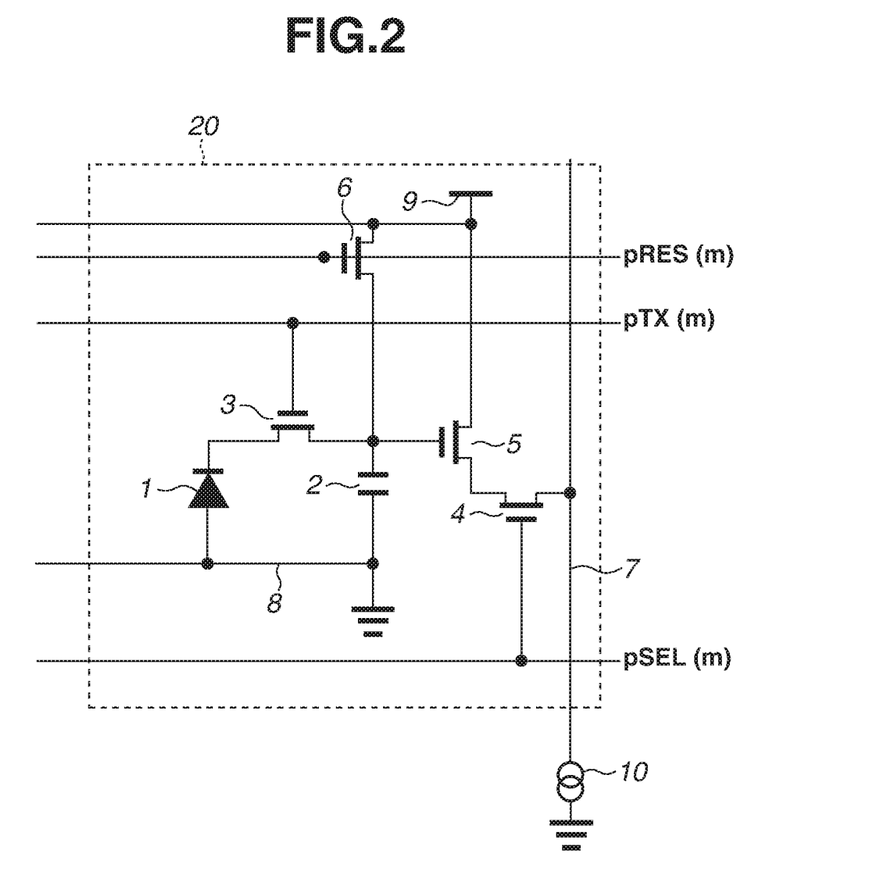
FIG. 2 is an equivalent circuit diagram illustrating a configuration of a pixel of the photoelectric conversion apparatus according to the first exemplary embodiment.

FIG. 2 is an equivalent circuit diagram illustrating a configuration of the pixel 20. The pixel 20 includes a photoelectric conversion unit 1, a floating diffusion 2, a transfer transistor 3, a selection transistor 4, an amplification transistor 5, and a reset transistor 6. The photoelectric conversion unit 1 is, for example, a photodiode, and has the anode connected to a ground voltage line and the cathode connected to the source of the transfer transistor 3. The drain of the transfer transistor 3 is connected to the source of the reset transistor 6 and the gate of the amplification transistor 5. A connection node of the drain of the transfer transistor 3, the source of the reset transistor 6, and the gate of the amplification transistor 5 is the floating diffusion 2. The floating diffusion 2 forms a charge-voltage conversion unit consisting of a capacitor component included in the above-described connection node. The drain of the reset transistor 6 and the drain of the amplification transistor 5 are connected to a power supply voltage line. The source of the amplification transistor 5 is connected to the drain of the selection transistor 4. The source of the selection transistor 4 is connected to a pixel output line 7. A current source 10 is connected to one end of the pixel output line 7. For example, a metal oxide semiconductor (MOS) transistor is used for each of these transistors.

The photoelectric conversion unit 1 photoelectrically converts incident light and accumulates photoelectrically converted signal carriers. When the transfer transistor 3 is turned on, the signal carrier of the photoelectric conversion unit 1 is transferred to the floating diffusion 2. The amplification transistor 5 forms a source follower, and outputs a signal based on the voltage of the floating diffusion 2 to the pixel output line 7 via the selection transistor 4. When the reset transistor 6 is turned on, the voltage of the floating diffusion 2 can be reset based on the voltage of a power terminal 9.

A common control signal is supplied from the vertical scanning circuit 101 to the pixels 20 in the same row. In other words, control signals pTX(m), pSEL(m), and pRES(m) are supplied to the transfer transistor 3, the selection transistor 4, and the reset transistor 6, respectively, of each of the pixels 20 in the m-th row. These transistors are each turned on when the control signal is at the high level, and turned off when the control signal is at the low level.

Figure 3:
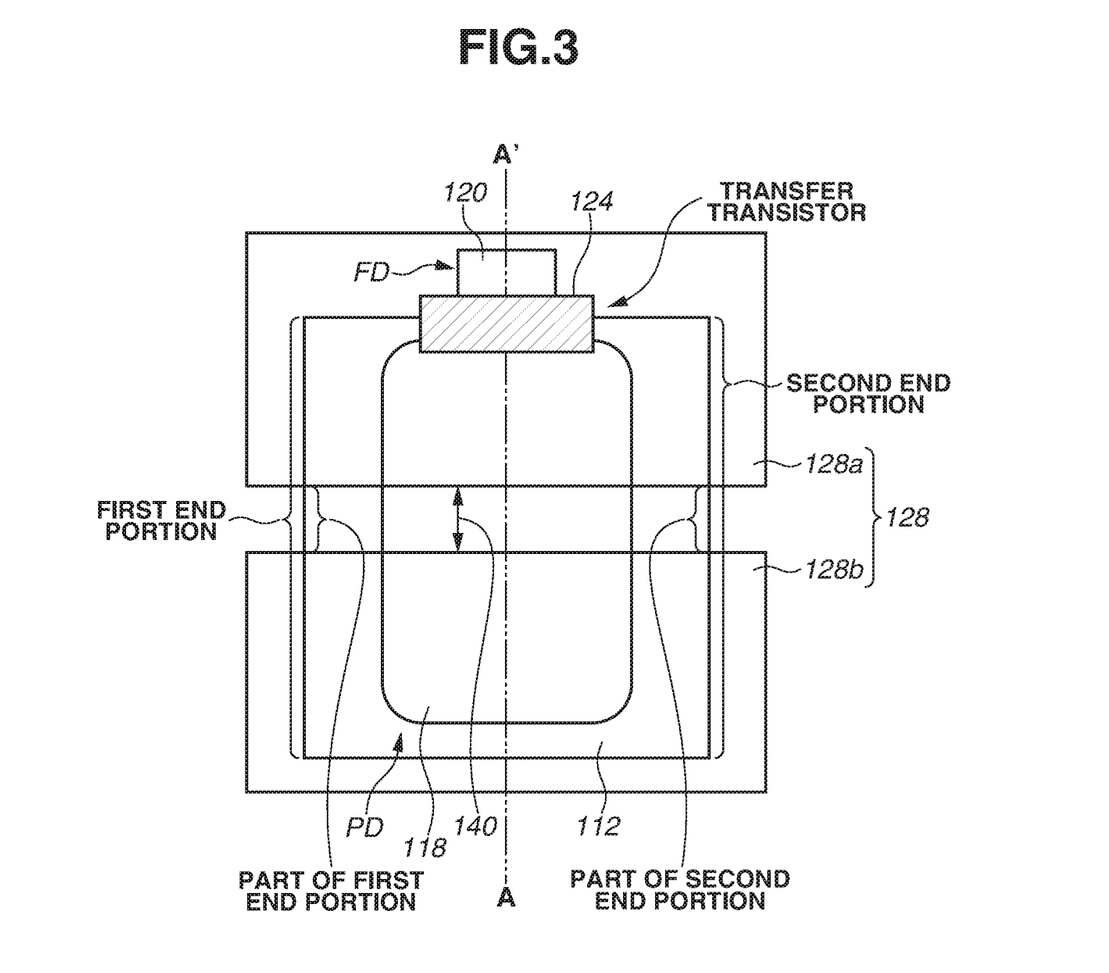
FIG. 3 is a schematic plan view of a structure of the pixel according to the first exemplary embodiment.
Figure 4:
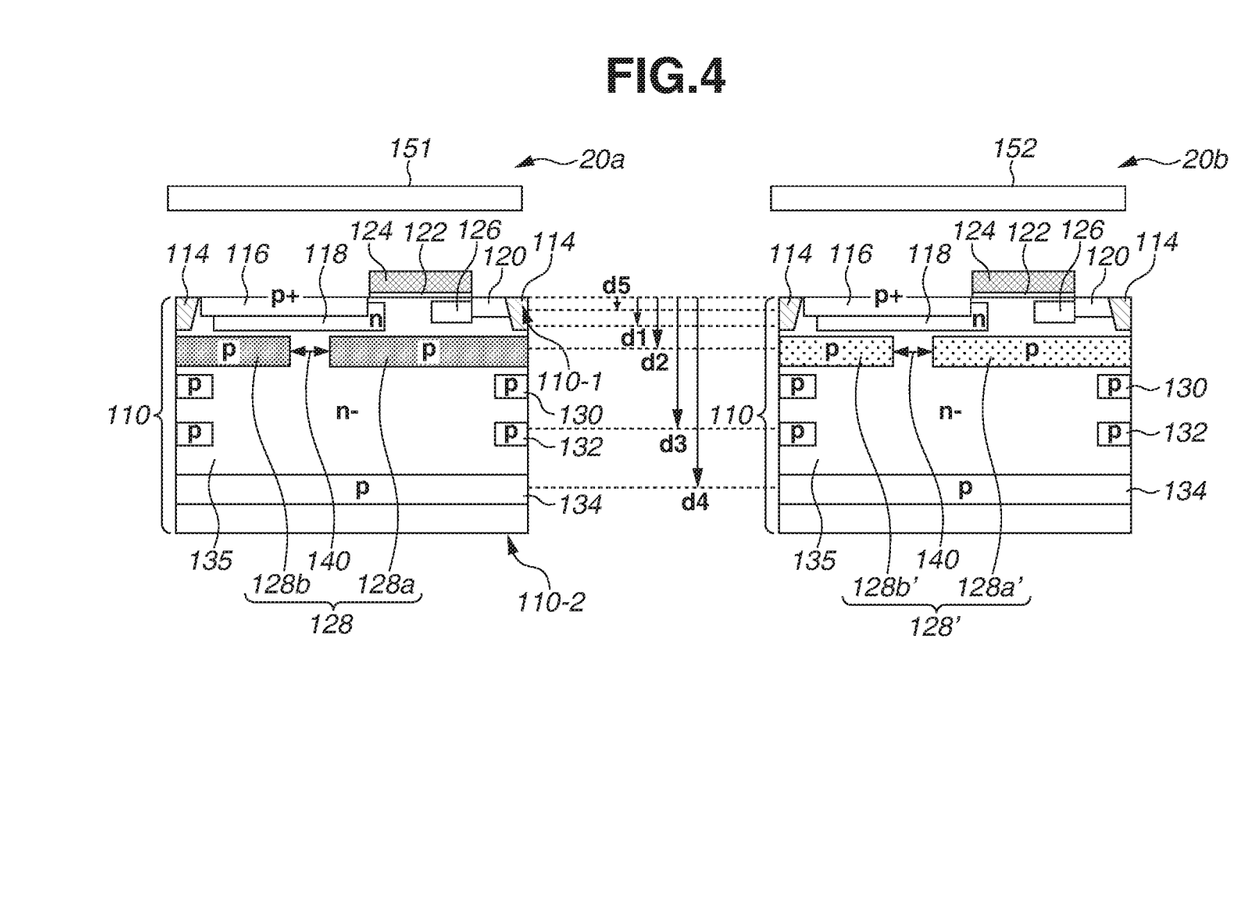
FIG. 4 is a schematic cross-sectional diagram illustrating each of a first pixel and a second pixel according to the first exemplary embodiment.

Next, a structure of the pixel of the present exemplary embodiment will be described. FIG. 3 is a diagram illustrating a planar layout of the pixel 20 of the present exemplary embodiment. FIG. 4 is a schematic cross-sectional diagram taken along a line A-A' in FIG. 3, of a first pixel 20a and a second pixel 20b. FIGS. 3 and 4 illustrate only the photoelectric conversion unit 1 and the transfer transistor 3, among the components of the pixel 20.

An isolation region 114 defining an active region 112 is near a first plane 110-1 of a semiconductor substrate 110. The isolation region 114 can include, for example, an insulator. Within the active region 112, the floating diffusion 2 and the photodiode forming the photoelectric conversion unit 1 are arranged. The floating diffusion 2 serves as a charge holding portion that holds signal careers transferred from the photoelectric conversion unit 1. The transfer transistor 3 includes the photoelectric conversion unit 1, the floating diffusion 2, and a gate electrode 124. A gate insulating layer 122 is arranged between the semiconductor substrate 110 and the gate electrode 124.

The photoelectric conversion unit 1 of the pixel 20 includes the first semiconductor region (an n-type semiconductor region 118) of the first conductivity type, and the second semiconductor region (a p-type semiconductor region 128) of the second conductivity type. The n-type semiconductor region 118 is disposed at a first depth d1 from the first plane 110-1, and the p-type semiconductor region 128 is disposed at a second depth d2 from the first plane 110-1 that is deeper than the first depth d1. Further, a fifth semiconductor region (a p-type semiconductor region 116) of the second conductivity type is disposed (at a fifth depth d5) between the first plane 110-1 and the n-type semiconductor region 118. The p-type semiconductor region 116 and the n-type semiconductor region 118 have a p-n junction plane. The n-type semiconductor region 118 is a charge accumulation region for accumulating signal careers generated in the photoelectric conversion unit 1.

The p-type semiconductor region 128 formed at the second depth d2 is a depletion reduction region for reducing expansion of a depletion layer from the n-type semiconductor region 118 toward a second plane 110-2. The p-type semiconductor region 128 is provided to form a p-n junction capacitance between the n-type semiconductor region 118 and the p-type semiconductor region 128. As expressed by a relational expression of Q=CV, an electric charge accumulation quantity Q increases as a p-n junction capacitance C increases, in a case where a predefined reverse bias voltage V is applied to the p-n junction of a photoelectric conversion unit. The signal carriers accumulated in the n-type semiconductor region 118 are transferred to an output portion. When the potential of the n-type semiconductor region 118 reaches a predetermined potential through a power supply voltage or the like, the signal carriers of the n-type semiconductor region 118 are no longer transferred. In other words, the variation amount of the voltage V accompanying the transfer of the signal carriers is predefined, and thus, the saturation charge quantity increases in proportion to the p-n junction capacitance of the photoelectric conversion unit. Therefore, the saturation charge quantity of the n-type semiconductor region 118 serving as a charge accumulation layer can be increased by providing the p-type semiconductor region 128.

In the present exemplary embodiment, the first pixel 20a is provided with a first filter 151 having a higher transmittance for visible light than that for infrared light, and the second pixel 20b is provided with a second filter 152 having a higher transmittance for the infrared light than that for the visible light. The first filter 151 is disposed to overlap with the n-type semiconductor region 118 of the photoelectric conversion unit (the first photoelectric conversion unit) included in the first pixel 20a in a planar view. The second filter 152 is disposed to overlap with the n-type semiconductor region 118 of the photoelectric conversion unit (the second photoelectric conversion unit) included in the second pixel 20b in a planar view. The light incident on the first photoelectric conversion unit after passing through the first filter 151 has a peak wavelength in a visible region (a wavelength λ<650 nm). The first filter 151 is, for example, a filter that transmits blue, red, or green light. The first filter 151 may be a filter that transmits at least one of cyan light, magenta light, and yellow light. The light incident on the second photoelectric conversion unit after passing through the second filter 152 has a peak wavelength in an infrared region (a wavelength λ≥650 nm).

Thus, in a case where the wavelength of the light incident on the first photoelectric conversion unit and the wavelength of the light incident on the second photoelectric conversion unit are different, the sensitivities of the respective photoelectric conversion units may vary. In the present exemplary embodiment, in the plurality of photoelectric conversion units that vary in sensitivity, the impurity concentrations of the respective p-type semiconductor regions 128 are set to different values, which reduces a decline in image quality. This will be described in detail below.

Figure 6:
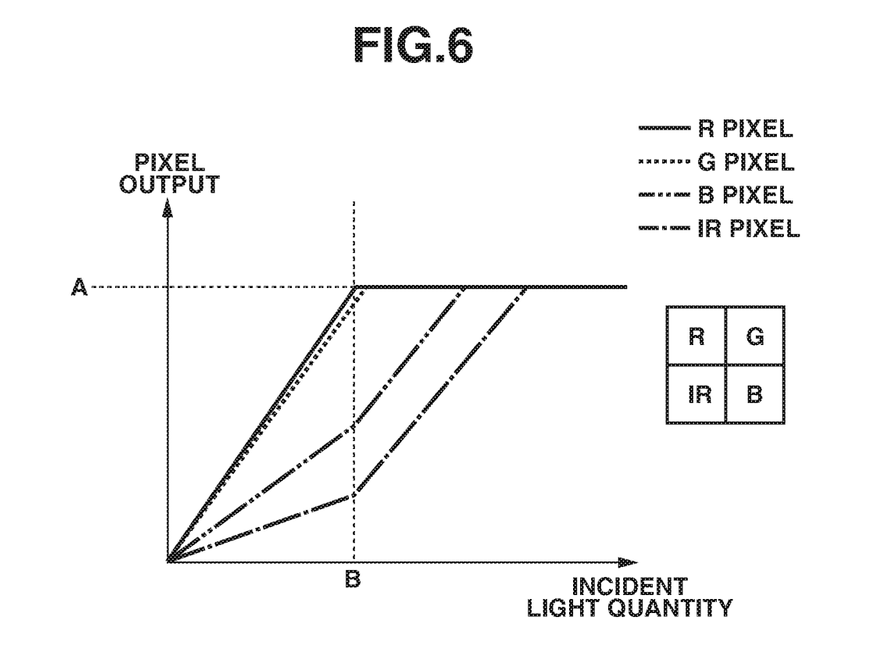
FIG. 6 is a diagram illustrating a pixel output with respect to an incident light quantity of a pixel of a photoelectric conversion apparatus according to a comparative example.

First, a comparative example will be described with reference to FIG. 6. FIG. 6 is a diagram illustrating an input-output characteristic of a pixel of a photoelectric conversion apparatus according to the comparative example A horizontal axis indicates an incident light quantity in a case where visible light from a visible light source is incident on the photoelectric conversion apparatus, and a vertical axis indicates an output from each pixel. In the following description, an R pixel is a pixel for photoelectrically converting red light, a G pixel is a pixel for photoelectrically converting green light, a B pixel is a pixel for photoelectrically converting blue light, and an IR pixel is a pixel for photoelectrically converting infrared light. In the comparative example, p-type semiconductor regions 128 in the respective pixels are configured to have the same impurity concentration. Therefore, the saturation charge quantities in the respective pixels are the same, so that the values of the pixel outputs from the respective pixels show the same value, i.e., a value A, when signal carriers are saturated.

In the comparative example, the R pixel reaches the output value A when the incident light quantity is at a value B, and the linearity of each of the IR pixel and the B pixel changes when the incident light quantity exceeds the value B. This is because the saturated signal carriers have leaked out from the R pixel into the IR pixel and the B pixel that are adjacent thereto. White balance is commonly carried out in a region where the pixel output is the value A or less and the linearity is maintained. However, in a case where the white balance of each of the IR pixel, the R pixel, the G pixel, and the B pixel is carried out, the white balance is calculated after the component of the IR pixel is removed from the R pixel, the B pixel, and the G pixel. This is because the component of the IR pixel is an offset output component that is not necessary for color development. For example, where the output of the R pixel after the white balance is carried out is R', the output of the original R pixel is R, and the output of the original IR pixel is IR, a following simple expression (1) can be used.

$$R'=R-IR \quad (1)$$

In medical uses and surveillance uses, it is desired that the output of the IR pixel and an RGC color image can be viewed in the same field of view, but there is a case where about 50% of the output of the B pixel is the output of the IR pixel, as illustrated in FIG. 6. Also with respect to the B pixel, in a case where the output component of the IR pixel is removed from the output of the B pixel based on an expression as shown by the above-described expression (1), the output of the B pixel easily decreases as compared with the R pixel and the G pixel. Therefore, in a case where the white balance is carried out, an image with tinges of yellow is obtained. In this way, depending on the ratio between the visible light component of the incident light and the component of the IR light, image quality may decline if the impurity concentrations of the respective p-type semiconductor regions 128 are set to the same value in all the pixels.

Therefore, in the present exemplary embodiment, the impurity concentration of the p-type semiconductor region 128 of the first pixel 20a and the impurity concentration of a p-type semiconductor region 128' of the second pixel 20b are set to different values. Specifically, the impurity concentration of the p-type semiconductor region 128 in each of the R pixel, the G pixel, and the B pixel is set to a value higher than the impurity concentration of the p-type semiconductor region 128' in the IR pixel. As described above, the p-n junction capacitance is formed between the p-type semiconductor region 128 and the n-type semiconductor region 118. The p-n junction capacitances of the R pixel, the G pixel, and the B pixel becomes greater than the p-n junction capacitance of the IR pixel, by setting the impurity concentration of the p-type semiconductor region 128 in the R pixel, the G pixel, and the B pixel to a value higher than the impurity concentration of the p-type semiconductor region 128' in the IR pixel. Therefore, the saturation charge quantity of the R pixel, the G pixel, and the B pixel that need a dynamic range can be made larger than the IR pixel, and the saturation of the electric charge of the R pixel, the G pixel, and the B pixel can be reduced.

Figure 5:
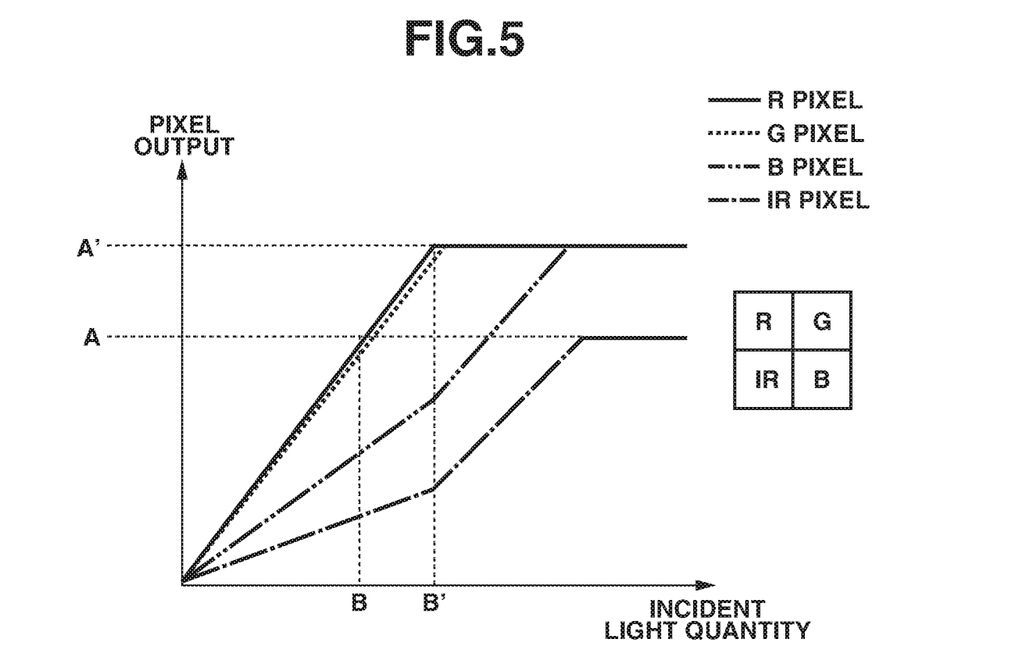
FIG. 5 is a diagram illustrating a pixel output with respect to an incident light quantity of the pixel of the photoelectric conversion apparatus according to the first exemplary embodiment.

FIG. 5 illustrates an input-output characteristic of the photoelectric conversion apparatus according to the present exemplary embodiment. This photoelectric conversion apparatus has a configuration similar to the photoelectric conversion apparatus according to the comparative example, except that the impurity concentrations of the p-type semiconductor regions 128 in the respective pixels are different. This is apparent because in FIG. 6 illustrating the comparative example, the R pixel reaches the value at which the pixel is saturated when the incident light quantity is at the value B. In contrast, in FIG. 5, the linearity of the output of the R pixel is maintained when the incident light quantity is at a value B' exceeding the value B. In this way, according to the present exemplary embodiment, the dynamic range expands from the value A to a value A' of the pixel output, so that a linearity region for carrying out the white balance can be increased. Therefore, a decline in image quality caused by a reduction in the RGB output due to the IR component can be suppressed.

The p-type semiconductor region 128 of the R pixel, the G pixel, and the B pixel and the p-type semiconductor region 128' of the IR pixel are formed in the semiconductor substrate 110 by ion implantation using different mask patterns. In this case, alternatively, the ion acceleration energy of the ion implantation for forming the p-type semiconductor region 128 and the p-type semiconductor region 128' may be set to be equal, and the ion implantation may be added to the p-type semiconductor region 128 separated on the basis of the mask patterns. Alternatively, these p-type semiconductor regions may be separated from the beginning on the basis of the mask patterns, and the ion implantation may be separately performed based on different ion concentrations.

As illustrated in FIG. 4, the p-type semiconductor region 128 is configured to have a stripe pattern extending in a row direction (in a lateral direction in FIG. 4) in the planar view. FIG. 4 illustrates two adjacent p-type semiconductor regions 128a and 128b both in the stripe pattern, and a gap 140 therebetween. The gap 140 between the p-type semiconductor region 128a and the p-type semiconductor region 128b crosses the n-type semiconductor region 118 in the planar view. Alternatively, when an area where the n-type semiconductor region 118 and the p-type semiconductor region 128a overlap each other is defined as a first area, and an area where the n-type semiconductor region 118 and the p-type semiconductor region 128b overlap each other is defined as a second area, it can also be said that the first area and the second area are separate from each other. Further, it can be said that the n-type semiconductor region 118 that is the first semiconductor region includes a first end portion and a second end portion opposite to the first end portion, in the planer view, and that the first area and the second area are separate with a gap that extends between a part of the first end portion and a part of the second end portion.

The gap 140 between the p-type semiconductor region 128a and the p-type semiconductor region 128b is a movement path for the signal carriers when the signal carriers generated within the semiconductor substrate 110 between the n-type semiconductor region 118 and a p-type semiconductor region 134 are collected in the n-type semiconductor region 118. Therefore, the electrons generated within the semiconductor substrate 110 between the n-type semiconductor region 118 and the p-type semiconductor region 134 can be quickly collected in the n-type semiconductor region 118, by appropriately setting the size and the shape of the gap 140, and the impurity concentration of the p-type semiconductor region 128. In other words, it is possible to obtain a sensitivity equal to a sensitivity obtained in a structure where the p-type semiconductor region 128 is not provided.

A third semiconductor region (an n-type semiconductor region 135) of the first conductivity type is disposed at a third depth d3 from the first plane 110-1 that is deeper than the second depth d2. The n-type semiconductor region 135 is a region having a lower impurity concentration than the n-type semiconductor region 118. The n-type semiconductor region 135 can function as a sensitivity region, by forming the n-type semiconductor region 135. In FIG. 4, the n-type semiconductor region 135 is disposed in the gap 140.

A fourth semiconductor region (the p-type semiconductor region 134) of the second conductivity type is disposed at a fourth depth d4 from the first plane 110-1 that is deeper than the third depth d3. The n-type semiconductor region 118 and the p-type semiconductor region 134 overlap each other, in the planer view. The p-type semiconductor region 134 defines a depth for effectively collecting the signal carriers generated within the semiconductor substrate 110. The p-type semiconductor region 134 is continuously disposed over the first photoelectric conversion unit and the second photoelectric conversion unit.

P-type semiconductor regions 130 and 132 are disposed in a region overlapping the isolation region 114, in the planer view. The p-type semiconductor regions 130 and 132 separate the pixel 20 from the adjacent pixel 20 in the inside of the semiconductor substrate 110.

The floating diffusion 2 is configured of an n-type semiconductor region 120 separate from the n-type semiconductor region 118.

(Modifications)

Modifications of the first exemplary embodiment will be described below. In the following modifications, a decline in image quality can also be suppressed by increasing the dynamic range of the pixel necessary to achieve the white balance.

In FIG. 3 and FIG. 4, the p-type semiconductor region 128 is configured to have the strip pattern extending in the row direction in the planer view, but may be configured to have the strip pattern extending in a column direction in the planer view. Also in this case, the gap 140 between the p-type semiconductor region 128a and the p-type semiconductor region 128b crosses the n-type semiconductor region 118 in the planar view.

In FIG. 3 and FIG. 4, the first area and the second area of the p-type semiconductor region 128 are separate from each other, but it is not important that the first area and the second area of the p-type semiconductor region 128 are separate from each other. For example, the gap 140 may be absent, so that the p-type semiconductor region 128 may not have separate areas. For example, the p-type semiconductor region 128 may be formed continuously over the first photoelectric conversion unit and the second photoelectric conversion unit. For example, the first photoelectric conversion unit and the second photoelectric conversion unit can be made different in the concentration of the p-type semiconductor region 128, by changing the mask pattern and performing the ion implantation using the changed mask pattern.

The second filter may include a layer for blocking the visible light. Further, the first filter may include a layer for blocking the infrared light. The layer for blocking the visible light is, for example, a layer that reflects or absorbs 95% or more of light having a wavelength $\lambda<670$ nm. The layer for blocking the infrared light is, for example, a layer that reflects or absorbs light of a wavelength $\lambda \geq 670$ nm.

So far, the example has been described in which the wavelength of the light passing through the first filter and the wavelength of the light passing through the second filter are different, but this example is not limitative. The wavelength of the light passing through the first filter and the wavelength of the light passing through the second filter may be the same. For example, in a case where the photoelectric conversion units that vary in sensitivity depending on the placement positions of the photoelectric conversion units are present, the saturation charge quantity can be adjusted by changing the impurity concentration in the p-type semiconductor region 128.

Further, both of the first filter and the second filter may be filters that transmit the visible light. For example, the first filter may have the peak of a transmission spectrum within a range of waves longer than 480 nm and 580 nm or less, and the second filter may have the peak of a transmission spectrum within a range of 400 nm or more and 480 nm or less.

The first filter and the second filter are not prerequisite, and may not be provided.

Figure 7:
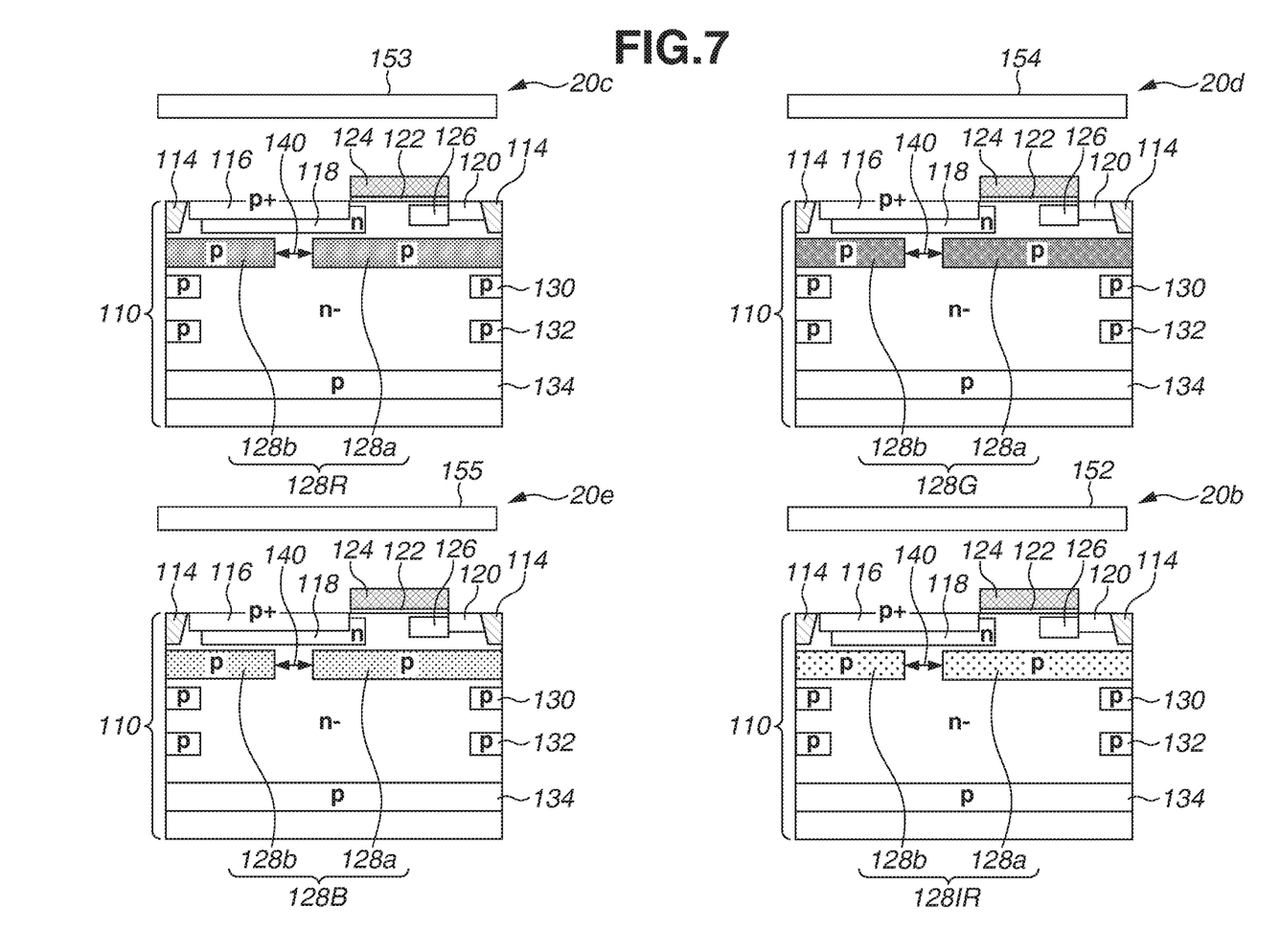
FIG. 7 is a schematic cross-sectional diagram illustrating each of a first pixel, a second pixel, a third pixel, and a fourth pixel according to a second exemplary embodiment.

A second exemplary embodiment of the present disclosure will be described with reference to FIG. 7. The present exemplary embodiment is different from the first exemplary embodiment, in that an IR pixel 20b, an R pixel 20c, a G pixel 20d, and a B pixel 20e are provided, and the impurity concentration of a second semiconductor region (a p-type semiconductor region 128) is different for each pixel.

In the present exemplary embodiment, the G pixel 20d includes a photoelectric conversion unit (a third photoelectric conversion unit), and the B pixel 20e includes a photoelectric conversion unit (a fourth photoelectric conversion unit). The third photoelectric conversion unit and the fourth photoelectric conversion unit each include a p-type semiconductor region 116 at a fifth depth, an n-type semiconductor region 118 at a first depth, and a p-type semiconductor region 128 at a second depth, as with the first exemplary embodiment. A p-type semiconductor region 128R of the R pixel 20c, a p-type semiconductor region 128IR of the IR pixel 20b, a p-type semiconductor region 128G of the G pixel 20d, and a p-type semiconductor region 128B of the B pixel 20e are different in the impurity concentration. The relationship between the impurity concentrations of the p-type semiconductor regions 128 is the second semiconductor region 128G>the second semiconductor region 128R>the second semiconductor region 128B>the second semiconductor region 128IR.

According to the present exemplary embodiment, the impurity concentration of the second semiconductor region 128G in the G pixel 20d which shows high sensitivity is made high, and the impurity concentration of the second semiconductor region 128IR in the IR pixel 20b shows low sensitivity is made low. The dynamic range of a pixel necessary to achieve white balance can be thereby expanded, so that a decline in image quality can be reduced.

In the above description, the impurity concentration of the p-type semiconductor region 128 in the G pixel is the highest, assuming that the sensitivity of the G pixel among the R, G, and B pixels is the highest, in other words, a pixel to be easiest saturated is the G pixel. However, a concentration order among the respective p-type semiconductor regions 128 is not limited to such a case, because the sensitivities of the respective pixels vary depending on the wavelength of incident light and the transmittance of a filter. In other words, the concentration of the p-type semiconductor region 128 is made higher with respect to a pixel which is in greater need of dynamic range.

Figure 8:
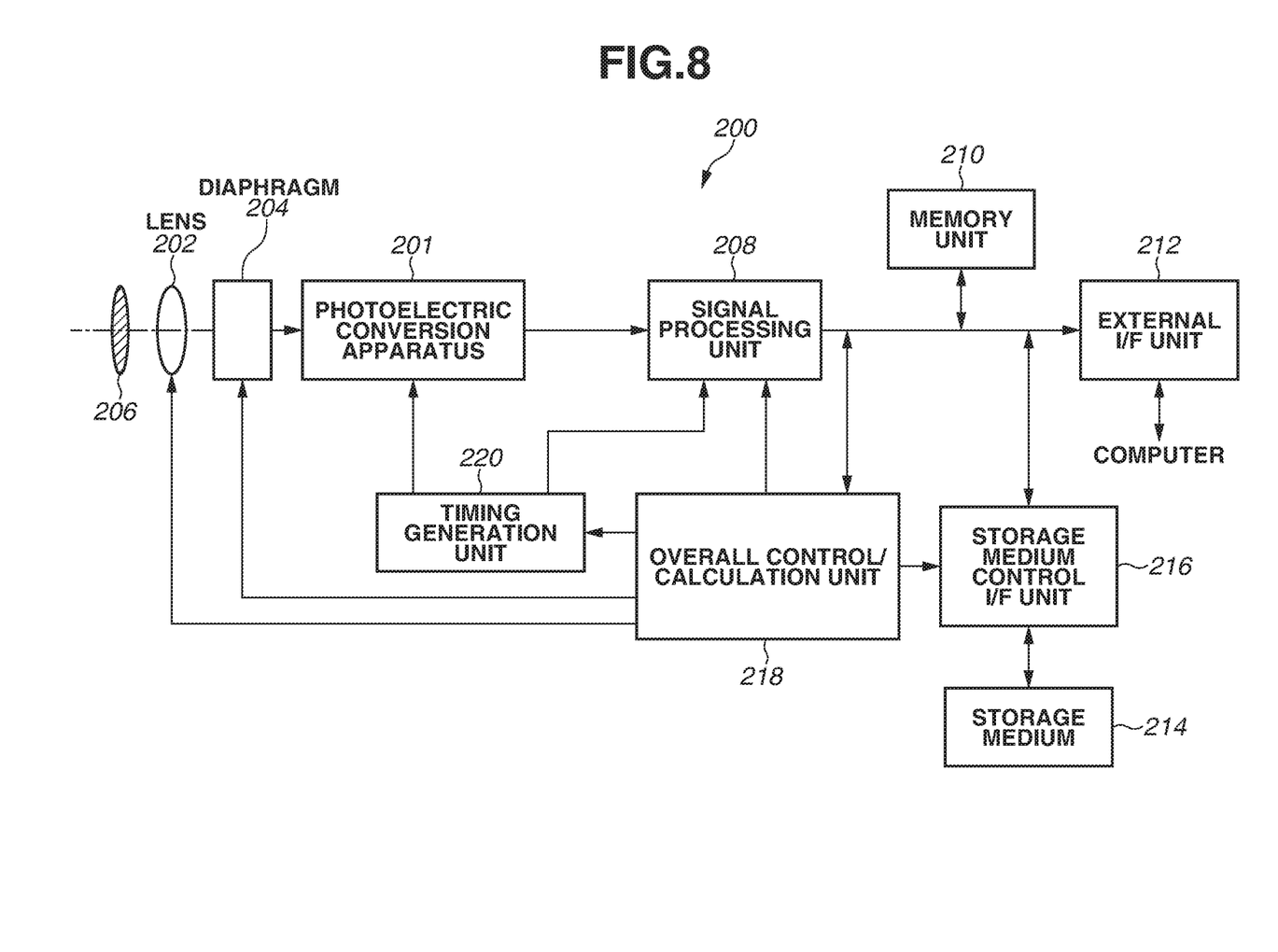
FIG. 8 is a block diagram illustrating a schematic configuration of a photoelectric conversion system according to a third exemplary embodiment.

A photoelectric conversion system according to a third exemplary embodiment will be described with reference to FIG. 8. Components similar to those of the photoelectric conversion apparatus in each of the above-described exemplary embodiments are provided with the same reference numerals, and will not be described or will be briefly described. FIG. 8 is a block diagram illustrating a schematic configuration of the photoelectric conversion system according to the present exemplary embodiment.

The photoelectric conversion apparatus described above in each of the exemplary embodiments is applicable to various kinds of photoelectric conversion system, as a photoelectric conversion apparatus 201 in FIG. 8. Examples of the photoelectric conversion system to which the above-described photoelectric conversion apparatus is applicable include a digital still camera, a digital camcorder, a surveillance camera, a copier, a facsimile, a mobile phone, an on-vehicle camera, and an observation satellite. A camera module equipped with an optical system such as a lens and a photoelectric conversion apparatus is also included in the photoelectric conversion system. FIG. 8 is a block diagram illustrating a digital still camera as one of these examples.

A photoelectric conversion system 200 illustrated in FIG. 8 includes the photoelectric conversion apparatus 201, a lens 202 that focuses an optical image of an object on the photoelectric conversion apparatus 201, a diaphragm 204 for making the quantity of light passing through the lens 202 variable, and a barrier 206 for protecting the lens 202. The lens 202 and the diaphragm 204 form an optical system for condensing light in the photoelectric conversion apparatus 201. The photoelectric conversion apparatus 201 is the photoelectric conversion apparatus described above in each of the exemplary embodiments, and converts the optical image focused by the lens 202 into image data.

The photoelectric conversion system 200 includes a signal processing unit 208 that processes a signal output from the photoelectric conversion apparatus 201. The signal processing unit 208 performs A/D conversion in which an analog signal output by the photoelectric conversion apparatus 201 is converted into a digital signal. Further, the signal processing unit 208 performs various corrections and compression as necessary and outputs the resultant image data. For example, the signal processing unit 208 performs white balance arithmetic processing for digital image data. The white balance for the image data can be adjusted when a signal value of each color signal corresponding to the image data output from the photoelectric conversion apparatus 201 is multiplied by a predetermined white balance coefficient. An A/D converter that is a part of the signal processing unit 208 may be formed in a semiconductor substrate provided with the photoelectric conversion apparatus 201, or may be formed in a semiconductor substrate different from the photoelectric conversion apparatus 201. Further, the photoelectric conversion apparatus 201 and the signal processing unit 208 may be formed in the same semiconductor substrate.

The photoelectric conversion system 200 includes a memory unit 210 for temporarily storing image data, and an external interface (I/F) unit 212 for communication with an apparatus such as an external computer. The photoelectric conversion system 200 further includes a storage medium 214 such as a semiconductor memory for recording or readout of captured-image data, and a storage medium control I/F unit 216 for recording on or reading out from the storage medium 214. The storage medium 214 may be built in or detachably mounted on the photoelectric conversion system 200.

The photoelectric conversion system 200 further includes an overall control/calculation unit 218 that controls various kinds of arithmetic operation and the entire digital still camera, and a timing generation unit 220 that outputs various timing signals to the photoelectric conversion apparatus 201 and the signal processing unit 208. Here, the timing signals may be input from outside, and the photoelectric conversion system 200 only has to include at least the photoelectric conversion apparatus 201, and the signal processing unit 208 that processes the signal output from the photoelectric conversion apparatus 201.

MODIFICATION EXEMPLARY EMBODIMENTS

The present disclosure can be modified in a variety of ways without being limited to the above-described exemplary embodiments. The embodiments of the present disclosure also include an example in which a part of the configuration of any exemplary embodiments is added to another exemplary embodiment and an example in which the part of the configuration is replaced with a part of another exemplary embodiment. Further, the modifications described in the first exemplary embodiment are applicable to the second exemplary embodiment.

According to the exemplary embodiments of the present disclosure, a decline in image quality can be prevented in a photoelectric conversion apparatus including a plurality of photoelectric conversion units varying in sensitivity.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-080494, filed Apr. 19, 2019, which is hereby incorporated by reference herein in its entirety.

What is claimed is:

1. A photoelectric conversion apparatus comprising:
a first photoelectric conversion unit disposed within a semiconductor substrate; and
a second photoelectric conversion unit disposed adjacent to the first photoelectric conversion unit within the semiconductor substrate,
wherein each of the first photoelectric conversion unit and the second photoelectric conversion unit includes,
a first semiconductor region of a first conductivity type that is disposed at a first depth from a first plane of the semiconductor substrate and has a majority carrier of a first polarity that is the same as a polarity of a signal carrier,
a second semiconductor region of a second conductivity type that is disposed at a second depth from the first plane of the semiconductor substrate and has a majority carrier of a second polarity, the second depth being deeper than the first depth,
a third semiconductor region of the first conductivity type disposed at a third depth from the first plane of the semiconductor substrate, the third depth being deeper than the second depth, and
a fourth semiconductor region of the second conductivity type disposed at a fourth depth from the first plane of the semiconductor substrate, the fourth depth being deeper than the third depth,
wherein the fourth semiconductor region is continuously disposed from the first photoelectric conversion unit to the second photoelectric conversion unit, and
wherein an impurity concentration of the second semiconductor region of the first photoelectric conversion unit and an impurity concentration of the second semiconductor region of the second photoelectric conversion unit are different at the second depth.

2. The photoelectric conversion apparatus according to claim 1, further comprising:
a first filter that overlaps the first semiconductor region of the first photoelectric conversion unit in a planar view; and
a second filter that overlaps the first semiconductor region of the second photoelectric conversion unit in a planar view,
wherein a wavelength of light passing through the first filter and a wavelength of light passing through the second filter are different.

3. The photoelectric conversion apparatus according to claim 2,
wherein the first filter has a transmittance for visible light higher than a transmittance for infrared light,
wherein the second filter has a transmittance for infrared light higher than a transmittance for visible light, and
wherein an impurity concentration of the second semiconductor region of the first photoelectric conversion unit is higher than an impurity concentration of the second semiconductor region of the second photoelectric conversion unit at the second depth.

4. The photoelectric conversion apparatus according to claim 2, the second filter blocks visible light.

5. The photoelectric conversion apparatus according to claim 2,
wherein the first filter has a peak of a transmission spectrum within a range of waves longer than 480 nm and 580 nm or less,
wherein the second filter has a peak of a transmission spectrum within a range of 400 nm or more and 480 nm or less, and
wherein an impurity concentration of the second semiconductor region of the first photoelectric conversion unit is lower than an impurity concentration of the second semiconductor region of the second photoelectric conversion unit, at the second depth.

6. The photoelectric conversion apparatus according to claim 1,
wherein the first semiconductor region includes a first end portion and a second end portion opposite to the first end portion in a planar view,
wherein the second semiconductor region includes a first area and a second area that overlap the first semiconductor region in the planar view, and
wherein the first area and the second area are separate with a gap that extends between a part of the first end portion and a part of the second end portion in the planar view.

7. The photoelectric conversion apparatus according to claim 1, wherein the second semiconductor region is continuously disposed between the first photoelectric conversion unit and the second photoelectric conversion unit.

8. The photoelectric conversion apparatus according to claim 1, wherein a fifth semiconductor region of the second conductivity type is disposed between the first plane of the semiconductor substrate and the first semiconductor region.

9. The photoelectric conversion apparatus according to claim 1, further comprising a third photoelectric conversion unit and a fourth photoelectric conversion unit disposed within the semiconductor substrate,
wherein the third photoelectric conversion unit and the fourth photoelectric conversion unit each include the first semiconductor region, the second semiconductor region, the third semiconductor region, and the fourth semiconductor region, and
wherein an impurity concentration of the second semiconductor region of the first photoelectric conversion unit, an impurity concentration of the second semiconductor region of the second photoelectric conversion unit, an impurity concentration of the second semiconductor region of the third photoelectric conversion unit, and an impurity concentration of the second semiconductor region of the fourth photoelectric conversion unit are different, at the second depth.

10. The photoelectric conversion apparatus according to claim 9, wherein a first filter overlapping the first photoelectric conversion unit, a second filter overlapping the second photoelectric conversion unit, a third filter overlapping the third photoelectric conversion unit, and a fourth filter overlapping the fourth photoelectric conversion unit, in a planer view, vary in wavelength of light that passes through.

11. The photoelectric conversion apparatus according to claim 10,
wherein the first filter transmits blue light,
wherein the second filter transmits infrared light,
wherein the third filter transmits red light, and
wherein the fourth filter transmits green light.

12. A photoelectric conversion system comprising:
the photoelectric conversion apparatus according to claim 1; and
a signal processing unit configured to process a signal output from the photoelectric conversion apparatus.

13. The photoelectric conversion system according to claim 12, wherein the signal processing unit adjusts white balance.

\* \* \* \* \*